(12) United States Patent
Park et al.

(10) Patent No.: US 7,531,449 B2
(45) Date of Patent: May 12, 2009

(54) METHOD OF FORMING FINE PATTERNS USING DOUBLE PATTERNING PROCESS

(75) Inventors: Sang-joon Park, Seocho-gu (KR);
Yong-hyun Kwon, Hwaseong-si (KR);
Jun Seo, Suwon-si (KR); Sung-il Cho,
Guro-gu (KR); Chang-jin Kang,
Seongnam-si (KR); Jae-kyu Ha,
Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 11/730,264

(22) Filed: Mar. 30, 2007

(65) Prior Publication Data

US 2008/0113511 A1    May 15, 2008

(30) Foreign Application Priority Data

Nov. 10, 2006  (KR)  ............. 10-2006-0111225

(51) Int. Cl.
*H01L 21/4763*    (2006.01)

(52) U.S. Cl. ................. 438/638; 438/637; 438/668

(58) Field of Classification Search ........... 438/703, 438/736–738, 638, 637, 668
See application file for complete search history.

(56) References Cited

U.S. PATENT DOCUMENTS 6,091,081 A * 7/2000 Matsubara et al. ........... 257/52
6,255,226 B1 * 7/2001 Zheng et al. .............. 438/734
2004/0266170 A1 * 12/2004 Yun ......................... 438/622
2005/0093082 A1 * 5/2005 Son et al. .................. 257/401
2005/0100799 A1 * 5/2005 Hagiwara .................. 430/5
2007/0249175 A1 * 10/2007 Chen ....................... 438/717
2007/0269721 A1 * 11/2007 Kim et al. .................. 430/5

FOREIGN PATENT DOCUMENTS

| JP | 2001-185701 | 7/2001 |
| KR | 1020060009420 A | 1/2006 |
| KR | 1020060056706 A | 5/2006 |

* cited by examiner

*Primary Examiner*—Fernando L Toledo
*Assistant Examiner*—Jae Lee
(74) *Attorney, Agent, or Firm*—Volentine & Whitt, PLLC

(57) ABSTRACT

A double pattern method of forming a plurality of contact holes in a material layer formed on a substrate is disclosed. The method forms a parallel plurality of first hard mask patterns separated by a first pitch in a first direction on the material layer, a self-aligned parallel plurality of second hard mask patterns interleaved with the first hard mask patterns and separated from the first hard mask patterns by a buffer layer to form composite mask patterns, and a plurality of upper mask patterns in a second direction intersecting the first direction to mask selected portions of the buffer layer in conjunction with the composite mask patterns. The method then etches non-selected portions of the buffer layer using the composite hard mask patterns and the upper mask patterns as an etch mask to form a plurality of hard mask holes exposing selected portions of the material layer, and then etches the selected portions of the material layer to form the plurality of contact holes.

20 Claims, 14 Drawing Sheets

METHOD OF FORMING FINE PATTERNS USING DOUBLE PATTERNING PROCESS

BACKGROUND OF THE INVENTION

1. Field of the Invention

The present invention relates to a method of forming fine patterns, such as those used in the fabrication of a semiconductor device using a double patterning process. More particularly, the invention relates to a method of forming contact holes having a very fine pitch using a double patterning process.

This application claims the benefit of Korean Patent Application No. 10-2006-0111225, filed on Nov. 10, 2006, the subject matter of which is hereby incorporated by reference.

2. Description of the Related Art

The fabrication of semiconductor devices involves the application of a complex sequence of processes. Included within this complex sequence are multiple processes adapted to form fine patterns on the various material layers forming contemporary semiconductor devices. The extreme integration densities that characterize contemporary semiconductor devices require the formation of patterns with very small geometries, vertical contact holes with very high aspect ratios, and/or very sharp pitches (i.e., relationships between pattern widths and corresponding separation distances between adjacent pattern components).

An aggregate measure or definition of these pattern sizes and relationships is commonly referred to as a design rule. Recent design rules for contemporary semiconductor devices have been drastically reduced to implement emerging integration density demands. The pressure created by these new design rules is pushing (or exceeding) the very limits of conventional fabrication techniques and related equipment. Indeed, available techniques and equipment can not accurately form the fine patterns and pitches demanded by new design rules.

Many of the inherent limitations of conventional techniques and equipment are related to the photolithography processes commonly applied to the formation of patterns. No where are such limitations more apparent than the formation of contact holes in an insulating layer. Contact holes are a basic structure used in semiconductor devices to vertically connect portions of overlying material layers.

As design rule geometries shrink, the lateral area of a contact hole is reduced relative to its vertical depth. In other words, its aspect ratio increases. The formation of relatively smaller and deeper contacts (i.e., contact holes with higher aspect ratios) presents great challenges to conventional photolithography processes which have reached the limit of their resolution. As a result, it is very difficult to reduce minimal separation distances between contacts (i.e., limitations imposed by conventional photolithography processes define contact hole alignment margins that preclude further reductions in the spacing of contact holes).

The formation of high aspect ratio contact holes presents other challenges unrelated to the resolution limitations imposed by conventional photolithography processes. For example, the physical formation of a contact hole requires etching of a material layer. Given the reduced contact hole alignment margins required by emerging design rules, relatively slow etching processes must be applied to the formation of contact holes. Unfortunately, such relatively low etch rate processes sometimes fail to fully form the desired set of contact holes and overall fabrication productivity and quality suffers.

SUMMARY OF THE INVENTION

Embodiments of the invention provides a method of forming fine patterns, such as those used in the fabrication of a semiconductor device, that includes a process of forming a contact hole pattern having a very fine pitch. Such a pattern may be formed despite the resolution limitations inherent in conventional photolithography processes.

In one embodiment of the invention, a method of forming a plurality of contact holes in a material layer formed on a substrate comprises; forming a parallel plurality of first hard mask patterns separated by a first pitch in a first direction on the material layer, forming a self-aligned parallel plurality of second hard mask patterns interleaved with the first hard mask patterns and separated from the first hard mask patterns by a buffer layer to form composite mask patterns, forming a plurality of upper mask patterns in a second direction intersecting the first direction to mask selected portions of the buffer layer in conjunction with the composite mask patterns, etching non-selected portions of the buffer layer using the composite hard mask patterns and the upper mask patterns as an etch mask to form a plurality of hard mask holes exposing selected portions of the material layer, and etching the selected portions of the material layer to form the plurality of contact holes.

BRIEF DESCRIPTION OF THE DRAWINGS

Embodiments of the invention will be described with reference to the attached drawings in which.

DESCRIPTION OF EMBODIMENTS

Embodiments of the invention will now be described with reference to the accompanying drawings. Throughout the drawings and written description, like reference numbers are used to indicate like or similar elements.

Figure 1A:
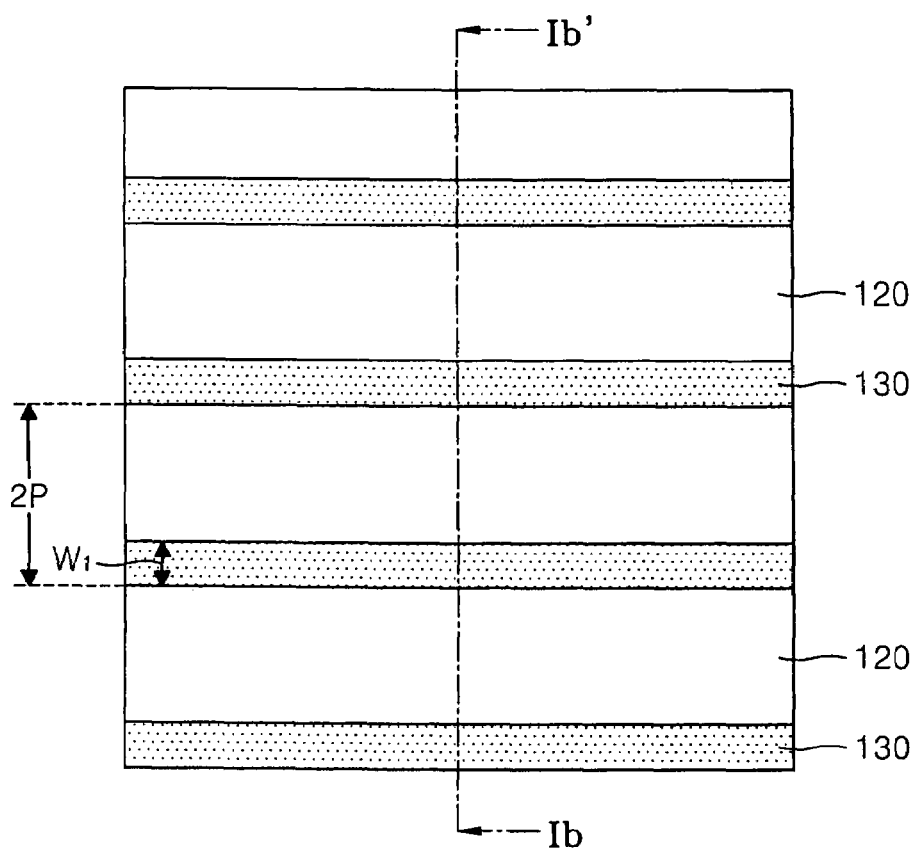
FIGS. 1A through FIG. 7B are views illustrating a method of forming fine patterns according to embodiments of the present invention.
Figure 1B:
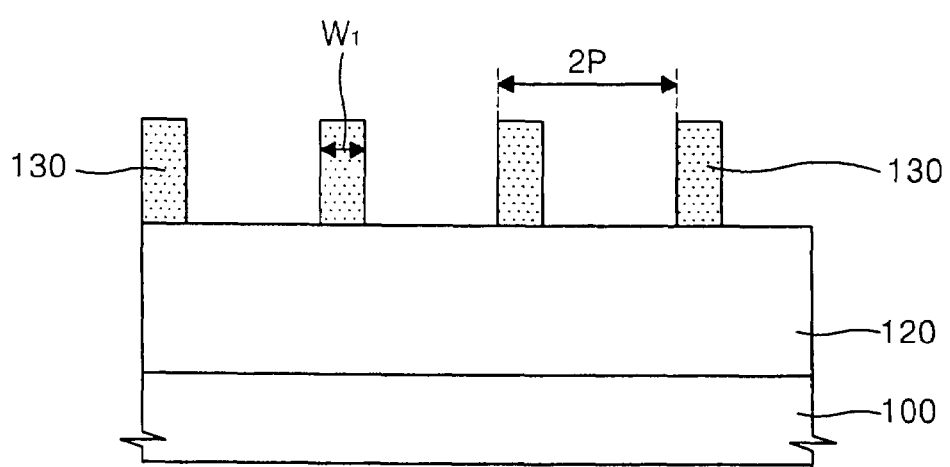
Figure 2A:
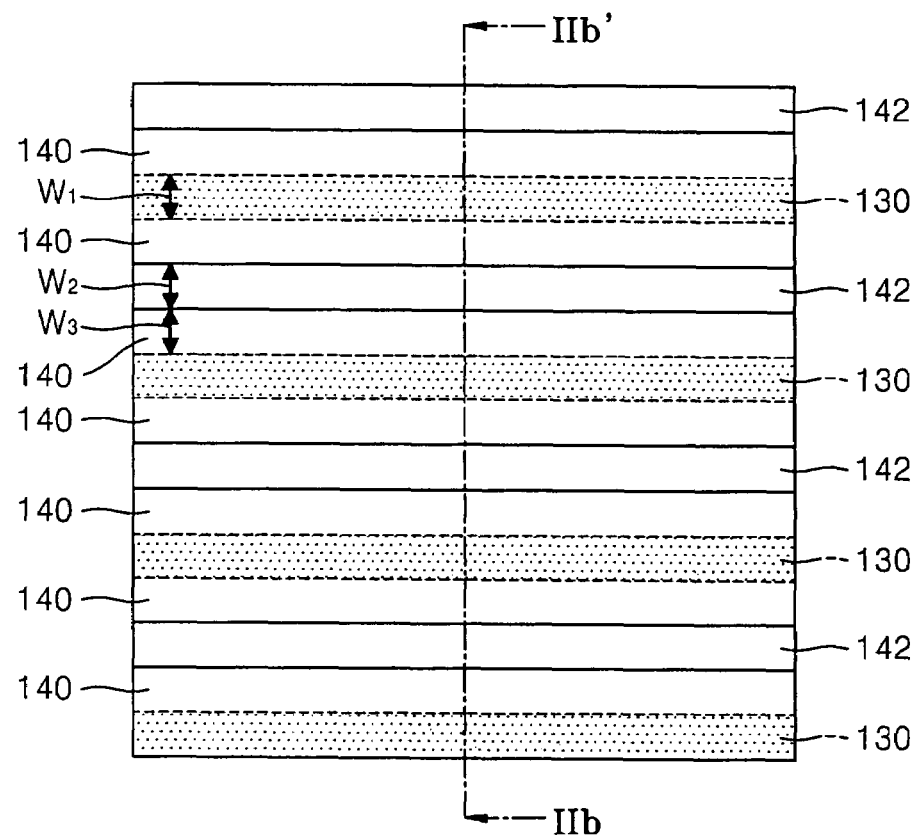
Figure 2B:
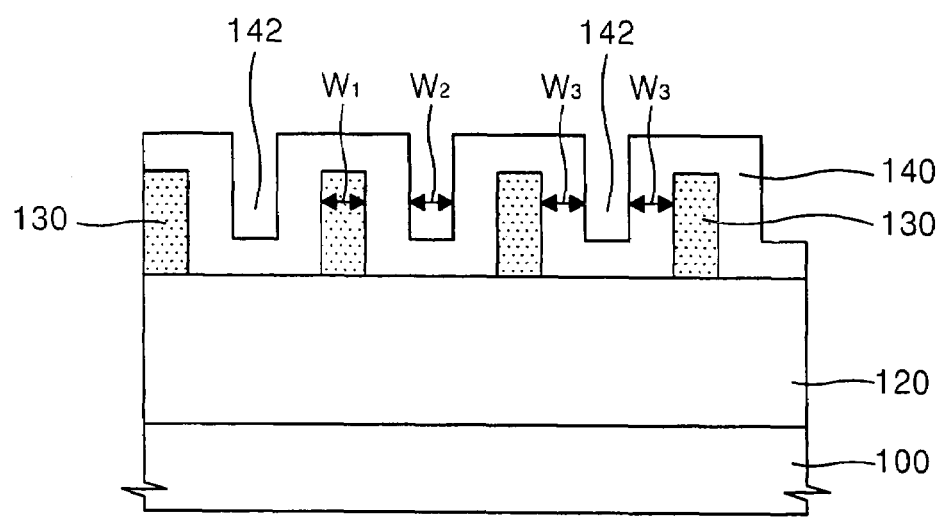
Figure 3A:
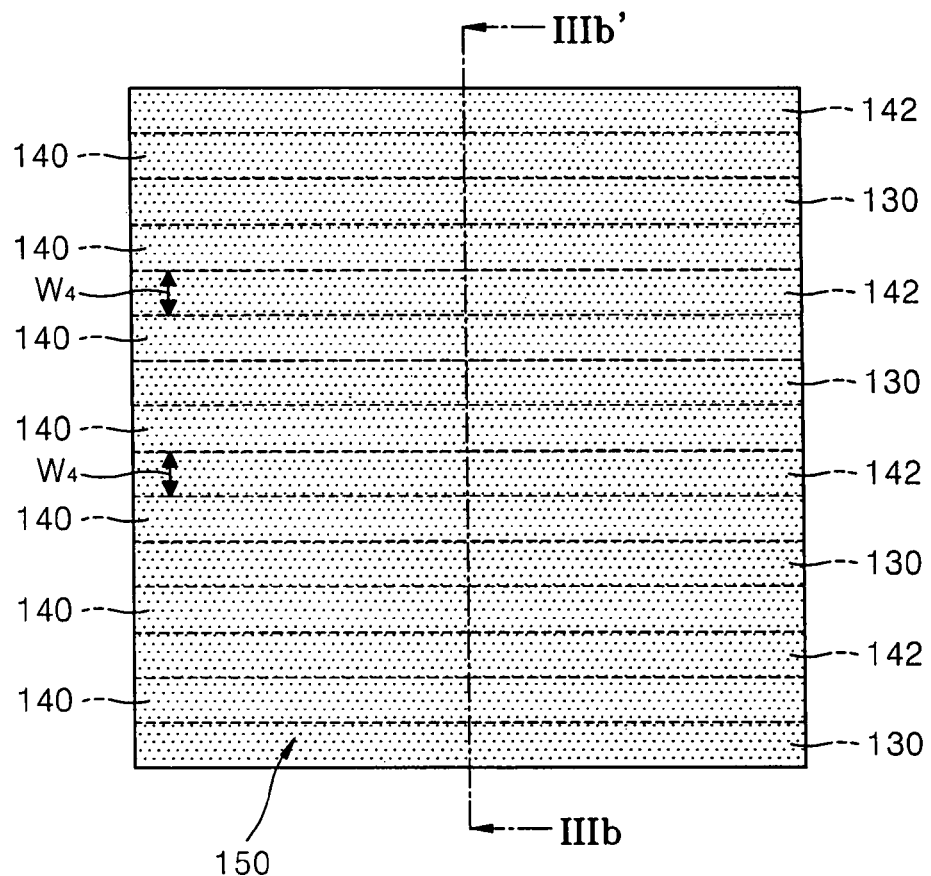
Figure 3B:
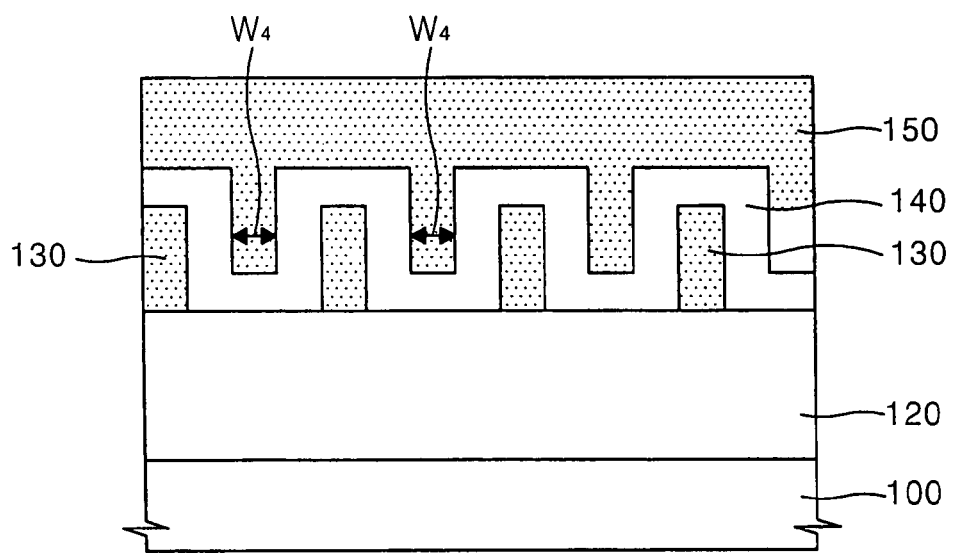
Figure 7A:
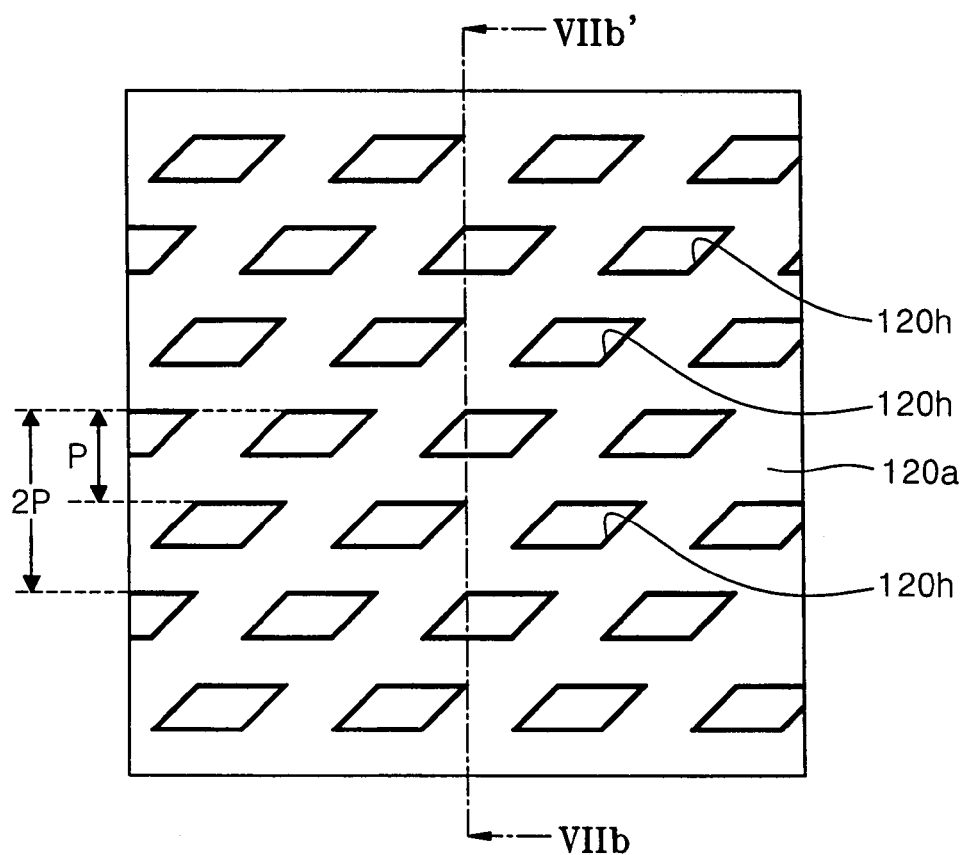
Figure 7B:
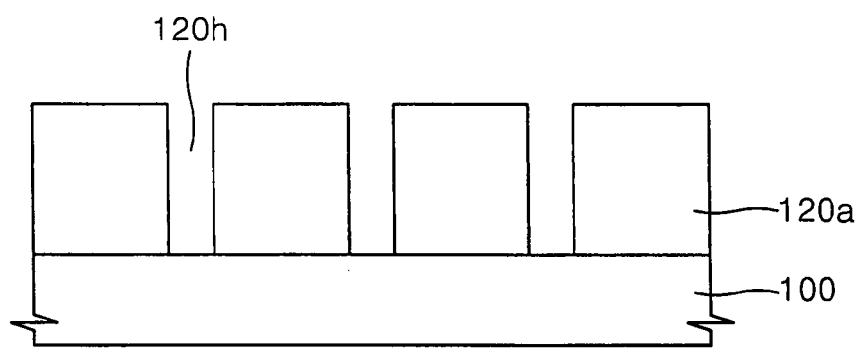

FIGS. 1A, 2A, 3A . . . FIG. 7A are plan views illustrating a method of forming fine patterns according to embodiments of the present invention. FIGS. 1B, 2B, 3B . . . FIG. 7B are related sectional views of FIGS. 1A, 2A, 3A . . . FIG. 7A respectively.

FIG. 1B is a sectional view taken along line Ib-Ib' of FIG. 1A. Referring to FIG. 1A and FIG. 1B, a material layer, such as an insulating layer, 120 is formed on a substrate 100. Material layer 120 may be formed with many different types of material compositions. Similarly, substrate 100 may take many different forms and be formed from different types of materials (e.g., semi-conducting, semi-insulating, glass, ceramic, silicon-on-insulator, etc.).

A conventional photolithography process is performed in relation to material layer 120 to form a plurality of first hard mask patterns 130. First hard mask patterns 130 have a first pitch "2P" that is two times greater than a final pitch "P" for the final hard mask patterns ultimately formed by the illustrated method. First hard mask patterns 130 are formed in a first parallel arrangement along a first direction. In the illustrated example, first hard mask patterns 130 are formed in a parallel line pattern, but this is just one possible example. Each first hard mask pattern 130A is formed with a first width W1. In the illustrated example, first width W1 is equal to ¼ of the first pitch 2P of first hard mask patterns 130, but other widths are possible. First hard mask patterns 130 may be formed from one or more of a number of different materials selected in relation to the material composition of material layer 120 and the etching process that will eventually be used to form a contact hole through material layer 120. For example, first hard mask patterns 130 may be formed from an oxide, a nitride, an oxynitride, a polysilicon, or a metal or metal alloy. In general, however, first hard mask patterns 130 will be formed from one or more materials having different etch characteristics than material layer 120 relative to an anticipated etching process.

FIG. 2B is a sectional view taken along line IIb-IIb' of FIG. 2A. Referring to FIG. 2A and FIG. 2B, a buffer layer 140 is formed with a uniform thickness (third width W3) on first hard mask patterns 130 and on portions of material layer 120 exposed through first hard mask patterns 130. Buffer layer 140 is formed with upper surface recesses 142 each having a second width W2 defined by the separation distance between adjacent first hard mask patterns 130 and the third width W3 on first hard mask patterns 130.

In the illustrated example, the third width W3 thickness of buffer layer 140 is defined such that the second width W2 of each upper surface recess 142 is equal to ¼ of the first pitch 2P. With this design definition, the third width W3 thickness of buffer layer 140 will also be ¼ of the first pitch 2P. That is, in the illustrated example, the third width W3 thickness of buffer layer 140 is equal to the second width W2 of each upper surface recess 142, and the first width W1 of each first hard mask pattern 130.

In one possible fabrication embodiment, buffer layer 140 is formed using an atomic layer deposition (ALD) method in order to ensure that buffer layer 140 has the desired uniform thickness on both the upper surface and sidewalls of first hard mask patterns 130, as well as the exposed portions of material layer 120. Buffer layer 140 will be formed from a material having different etch characteristics from those of first hard mask patterns 130 (i.e., a different etch selectivity) relative to a predetermined etching process.

In some embodiments buffer layer 140 may be formed from at least one oxide selected from a group oxides including a thermal oxide, a chemical vapor deposition (CVD) oxide, an un-doped silicate glass (USG), and a high density plasma (HDP) oxide. Alternately, buffer layer 140 may be formed from a nitride, an oxynitride, a polysilicon, a metal or metal alloy.

In one embodiment that assumes first hard mask patterns 130 are formed from an oxide or a polysilicon, buffer layer 140 may be formed from at least one nitride layer selected from the group consisting of SiON, SiN, SiBN and BN.

In another embodiment, that assumes first hard mask patterns 130 are formed from an oxide or a nitride, buffer layer 140 may be formed from a polysilicon layer.

More generally speaking, however, buffer layer 140 will be formed from a material having different etch characteristics from the material forming first hard mask patterns 130 and the material forming material layer 120 relative to a predetermined etching process.

FIG. 3B is a sectional view taken along line IIIb-IIIb' of FIG. 3A. Referring to FIG. 3A and FIG. 3B, a second hard mask layer 150 is formed on the resultant structure shown in FIG. 2B, including buffer layer 140. Second hard mask layer 150 may be formed from a material having the same (or similar) etch characteristics as the material forming first hard mask patterns 130. For example, second hard mask layer 150 may be formed from an oxide, a nitride, an oxynitride, a polysilicon or metal. In one embodiment assuming buffer layer 140 is formed from an oxide or nitride, second hard mask layer 150 may be formed from a polysilicon.

In the illustrated example, second hard mask layer 150 is formed to completely fill upper surface recesses 142. Continuing forward with the working example that assumes a third width W3 thickness for buffer layer 140 equal to ¼ of the first pitch 2P, second mask layer 150 will include downwardly extending fill portions having a fourth width W4 and filling upper surface recesses 142. Under the foregoing assumptions, fourth width W4 is equal to second width W2 for each upper surface recess 142 which is equal to ¼ of the first pitch 2P.

Figure 4A:
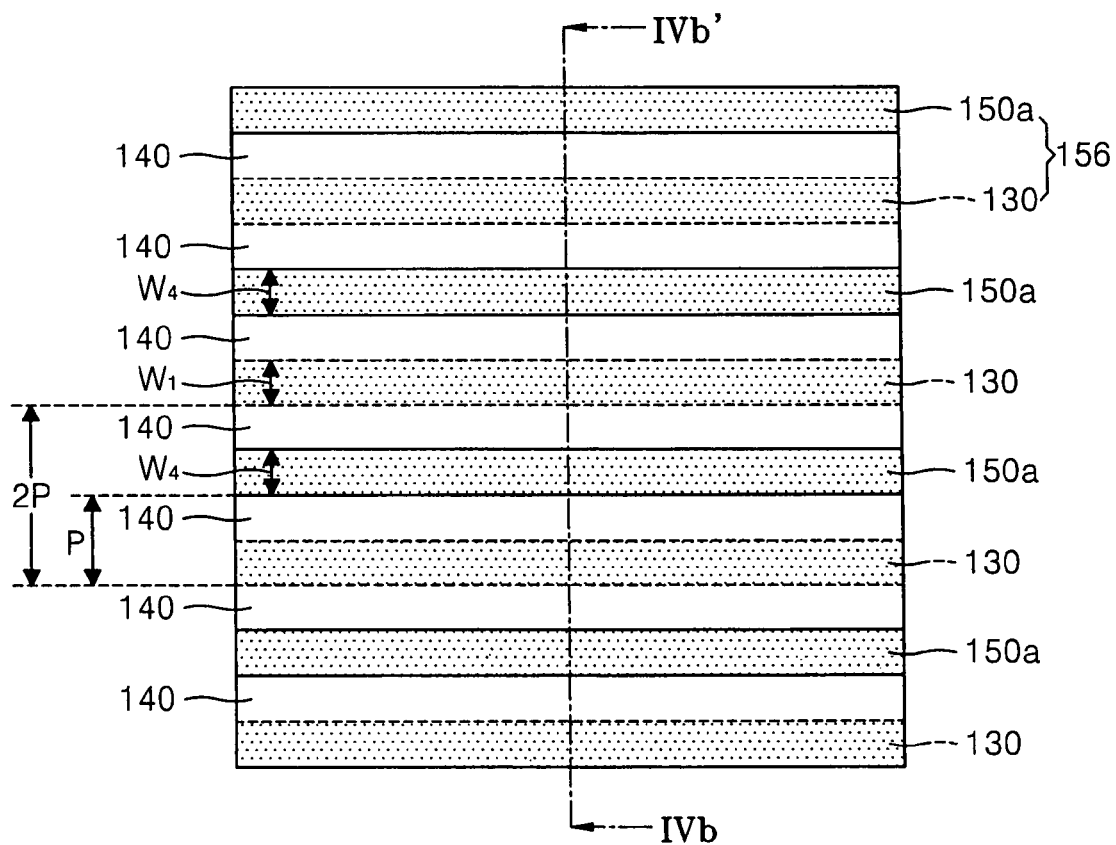
Figure 4B:
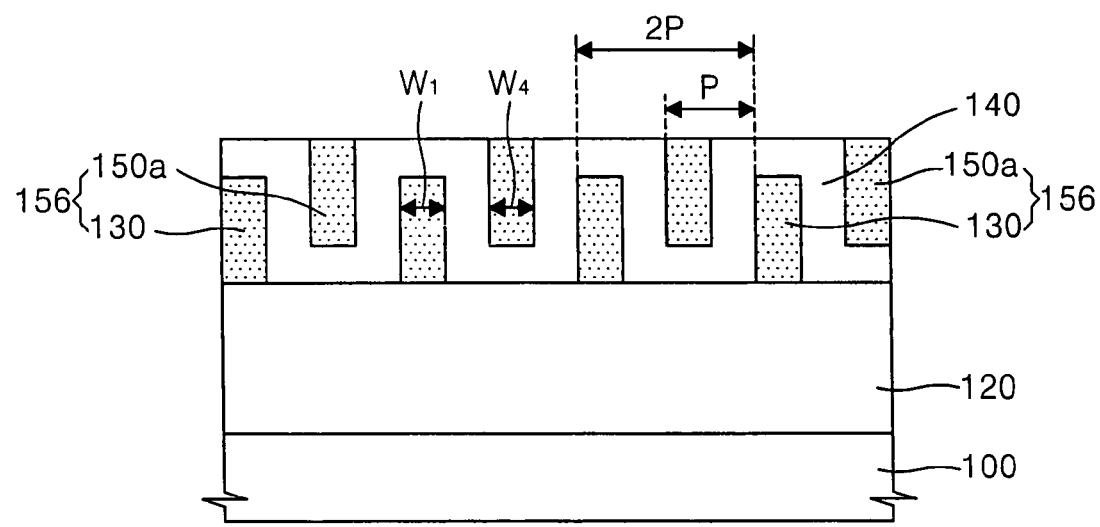

FIG. 4B is a sectional view taken along line IVb-IVb' of FIG. 4A. Referring to FIG. 4A and FIG. 4B, an upper portion of second hard mask layer 150 is selectively removed to expose the upper surface of buffer layer 140, and thereby form a plurality of second hard mask patterns 150a in-filling the upper surface recesses 142 respectively. In one possible fabrication example, a chemical mechanical polishing (CMP) process may be conventionally applied to remove the upper portion of second hard mask layer 150.

In the illustrated embodiment, second hard mask patterns 150a are aligned in a second parallel arrangement parallel to and along the first direction defining the first parallel arrangement of first hard mask pattern 130. Here again, second hard mask patterns 150a are formed in a line pattern.

Interleaving first hard mask patterns 130 and second hard mask patterns 150a form a plurality of composite hard mask patterns 156 that will be used as an etching mask during an etching process (e.g., a dry etch process) subsequently applied to material layer 120. Each one of the paired hard mask pattern elements (i.e., one from the plurality of first hard mask patterns 130 and one from the plurality of second hard mask patterns 150a) forming each one of the plurality of composite hard mask patterns 156 has a similar width (e.g., first width W1 and fourth width W4, each equal to ¼ the first pitch 2P). Accordingly, composite hard mask patterns 156 has a final pitch P half that of first pitch 2P. Hereafter each composite mask pattern 156 is said to comprise a first composite mask pattern element formed from one first hard mask pattern 130 and a related second composite mask pattern element formed from one second hard mask pattern 150.

Figure 5A:
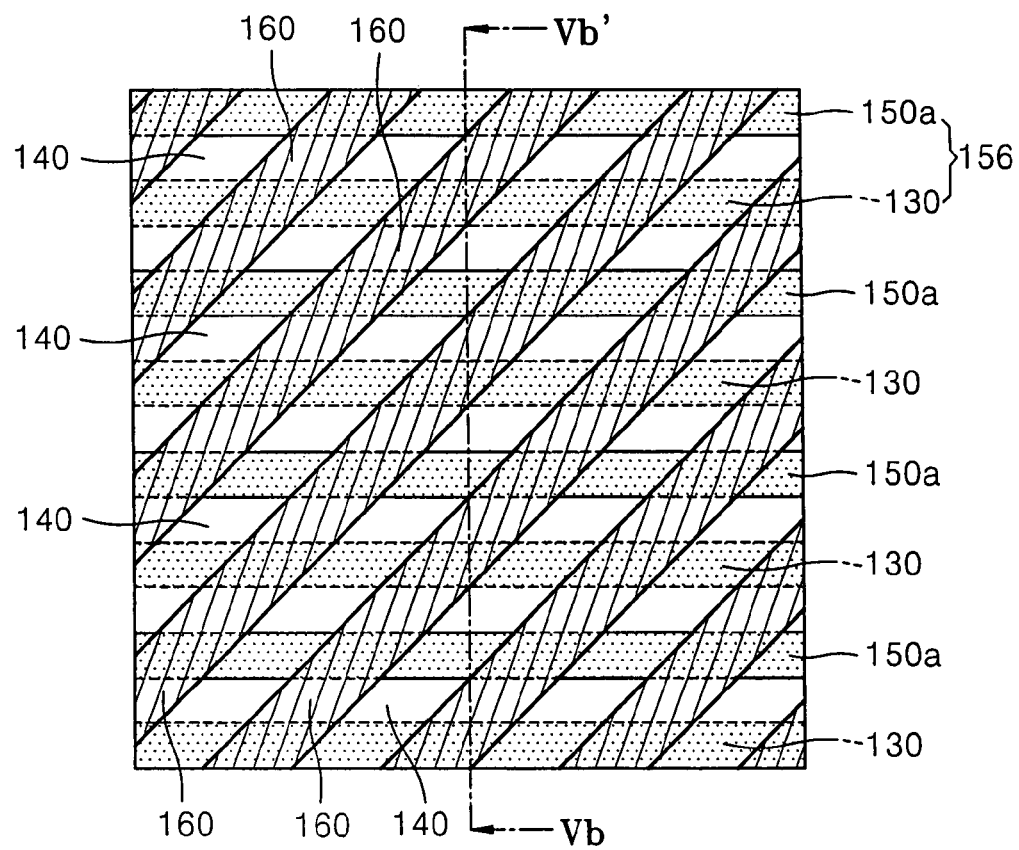
Figure 5B:
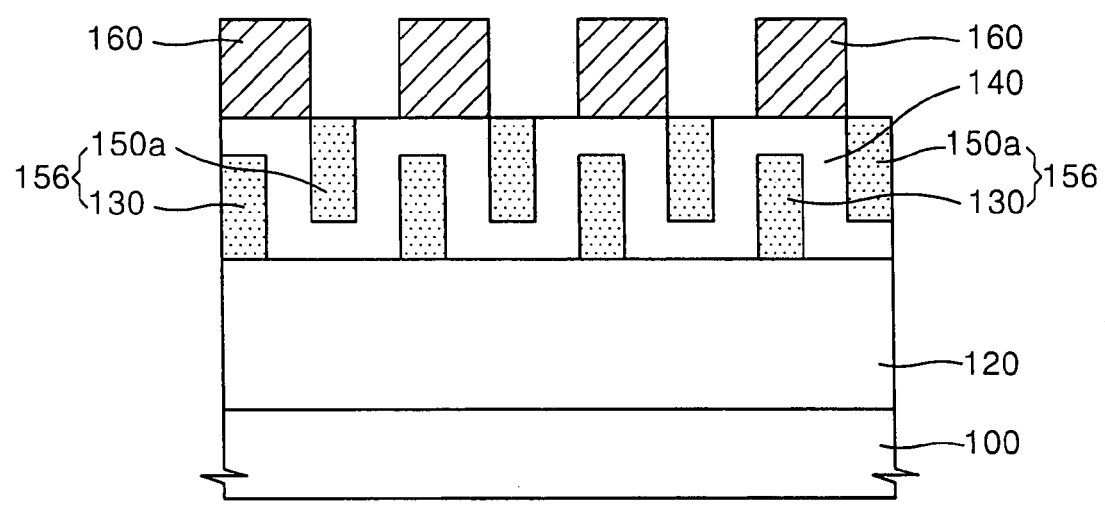

FIG. 5B is a sectional view taken along line Vb-Vb' of FIG. 5A. Referring to FIGS. 5A and 5B, upper mask patterns 160 are formed on the resultant structure shown in FIG. 4B and including composite hard mask patterns 156. Upper mask patterns are formed along a second direction intersecting the first direction so as to partially cover a selected portion of the upper surface of buffer layer 140 and a respective first composite mask pattern element 130 in a composite hard mask pattern 156.

As shown in the illustrated example of FIG. 5A, upper mask patterns 160 may be aligned in a diagonal second direction relative to a horizontally oriented first direction. In certain embodiments of the invention this diagonal second direction may range from between about 5 to 90 degrees relative to the first direction.

Upper mask patterns 160 may be formed with various geometric properties in accordance with the desired shape and size of the contact holes to be formed through material layer 120.

In the foregoing configuration, upper mask patterns 160 expose a predetermined portion of the upper surface of buffer layer 140 and second hard mask patterns 150a. The exposed portion of the upper surface of buffer layer 140 corresponds to placement of contact holes formed through material layer 120 during a subsequent etching process.

Upper mask patterns 160 may be formed, for example, from a photoresist layer, a three-layered structure formed by a spin on carbon (SOC) film, a Si anti-reflective coating (ARC) film, and a photoresist layer, or a four-layered structure formed by a SOC film, a Si ARC film, an organic ARC film, and a photoresist layer.

Figure 6A:
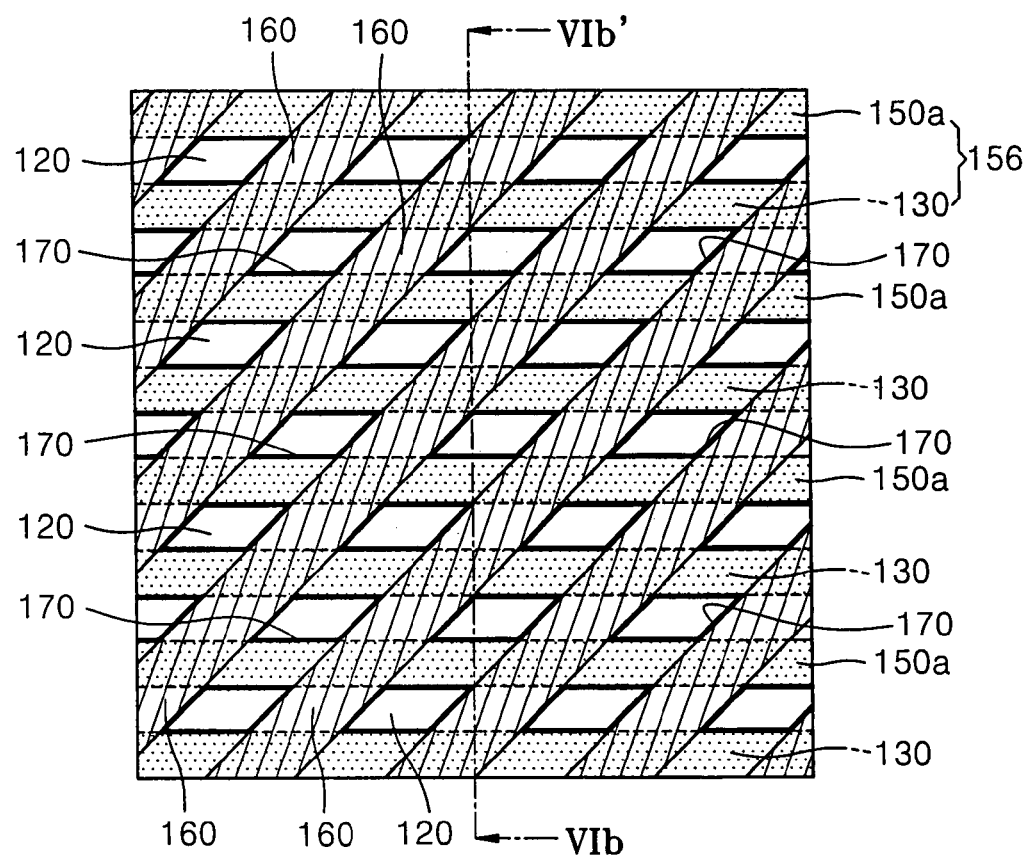
Figure 6B:
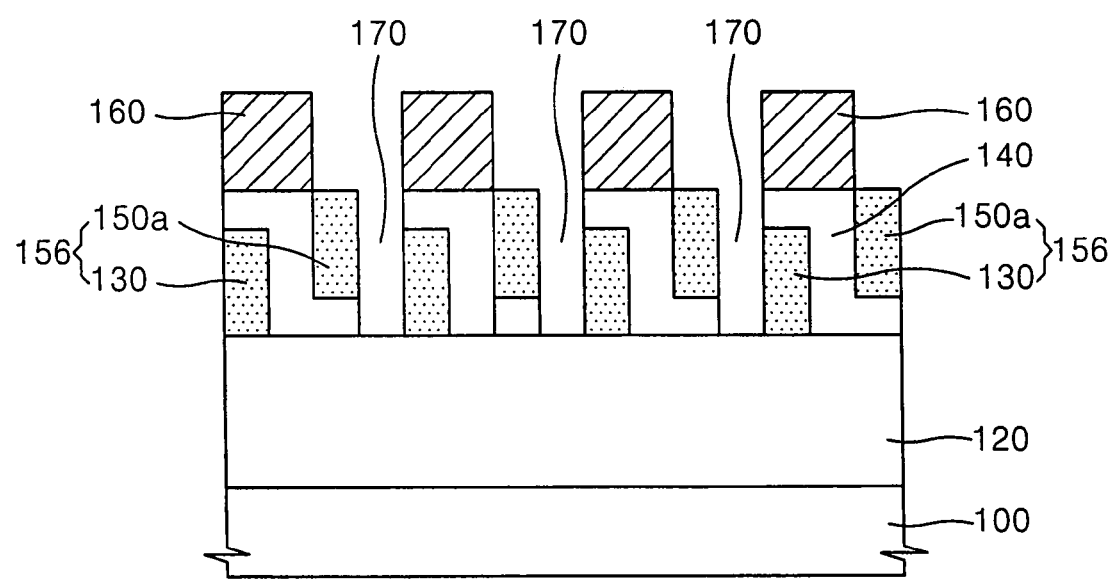

FIG. 6B is a sectional view taken along line VIb-VIb' of FIG. 6A. Referring to FIG. 6A and FIG. 6B, the exposed (i.e., portions non-selected by the masking operation performed by upper mask patterns 160) portion of buffer layer 140 is anisotropically etched using upper mask patterns 160 and composite mask patterns 156 as an etch mask, thereby forming a plurality of hard mask holes 170. Each hard mask hole 170 exposes the sidewall of a first composite hard mask pattern element 130 and the sidewall of a corresponding second composite hard mask pattern element 150a. A dry etching process or a plasma enhanced reactive ion etching process may be used to form hard mask holes 170. An upper surface region of material layer 120 is exposed through each hard mask hole 170.

FIG. 7B is a sectional view taken along line VIIb-VIIb' of FIG. 7A. Referring to FIG. 7A and FIG. 7B, the portions of material layer 120 exposed through hard mask holes 170 may now be anisotropically etched using upper mask patterns 160 and composite hard mask patterns 156 as an etch mask to thereby form patterned insulating layer 120a containing a plurality of contact holes 120h. At this point in the fabrication process, upper mask patterns 160, residual portions of buffer layer 140, first hard mask patterns 130, and second hard mask patterns 150a remaining on patterned material layer 120a may be removed.

Contact holes 120h formed through patterned material layer 120a are aligned and separated on semiconductor substrate 100 by a final pitch P that is half the first pitch 2P. Assuming that first pitch 2P is the minimum pitch that may be accurately implemented using a conventional photolithography process, final pitch P of contact holes 120h may be up to half as small the original pitch limit. Thus, embodiments of the invention offer dramatic improvements in the realizable pitch between adjacent contact holes in a set of fabrication contact holes.

In the foregoing embodiments, the interleaving first and second hard mask patterns may be formed using a self-aligned process. Since contact holes 120h in the illustrated example are formed using a dry etching process in conjunction with composite hard mask patterns 156 and upper mask patterns 160, they may be formed with proper alignment and with sufficient etching margin. Contact holes 120h may be readily formed with a desired cross-section geometry by manipulating the respective geometries and layout orientation of first hard mask patterns 130, second hard mask patterns 150a, and upper mask patterns 160.

Figure 8:
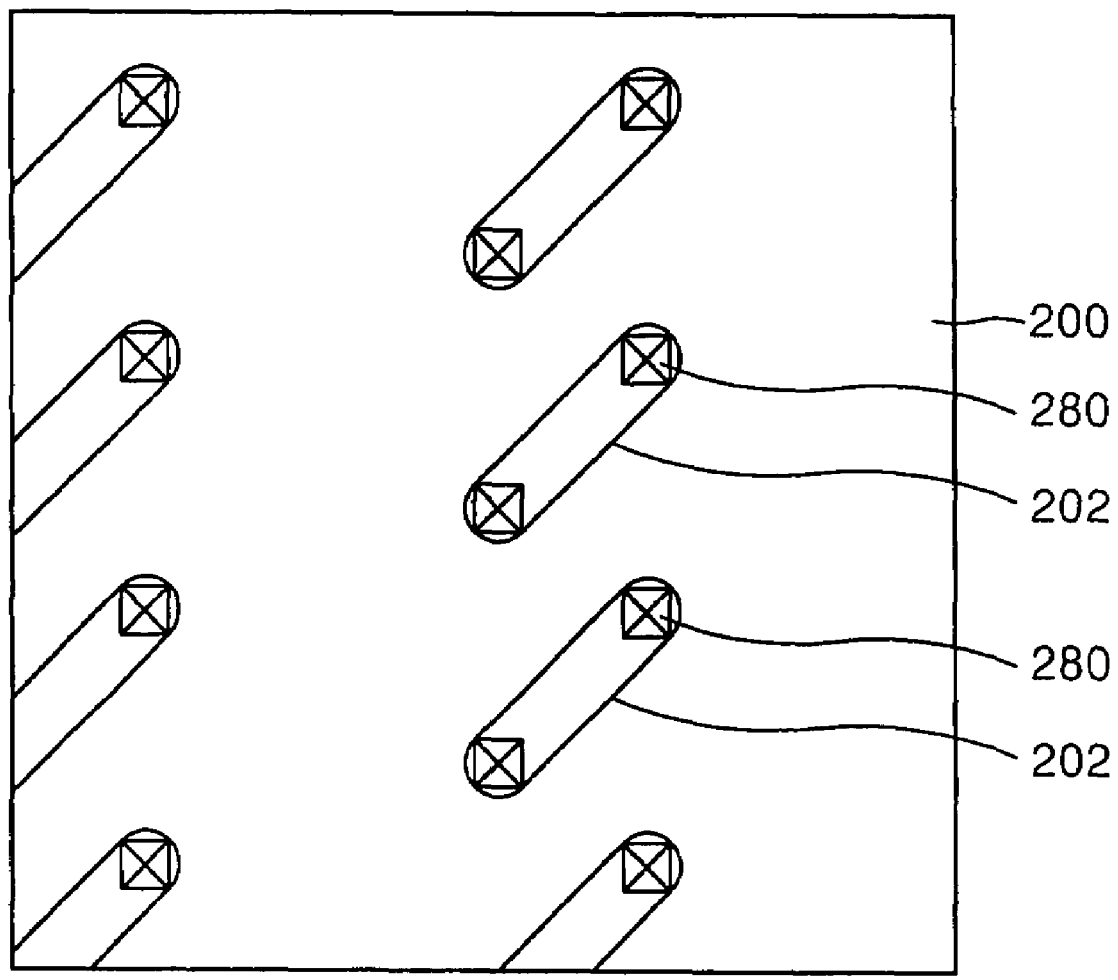
FIG. 8 is a layout diagram of an exemplary set of contacts realized by a method of forming fine patterns according to an embodiment of the present invention.

FIG. 8 is a layout diagram illustrating a set of contacts 280 which may be realized using a fabrication method consistent with an embodiment of the present invention. In FIG. 8, each contact 280 may be electrically connected within one of a plurality of island-shaped active regions 202 on a semiconductor substrate 200. The set of contacts may serve many different purposes, such as for example, a buried contact (BC) electrically connecting the storage node of a capacitor to a corresponding active region 202, or a direct contact (DC) electrically connecting a bit line to a corresponding active region 202. The geometry and composition of active regions 202, as well as the geometry and layout of contacts 280 will vary by application, the example illustrated in FIG. 8 being one of many such possibilities.

Figure 9A:
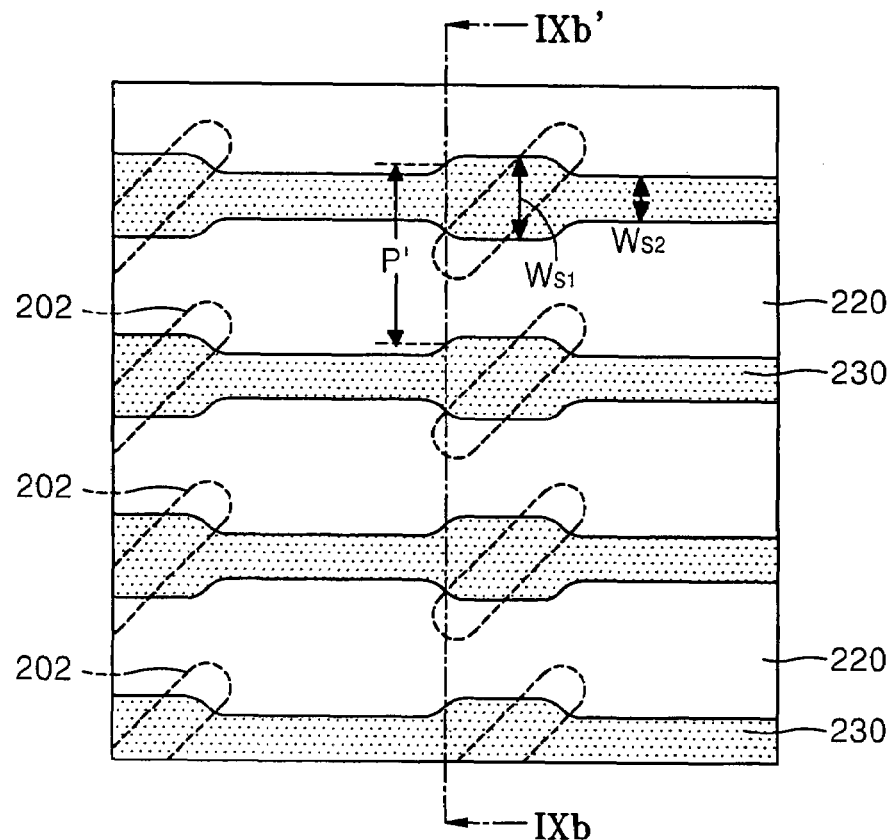
FIGS. 9A through FIG. 14B are views illustrating a method of forming fine patterns according to another embodiment of the present invention.
Figure 9B:
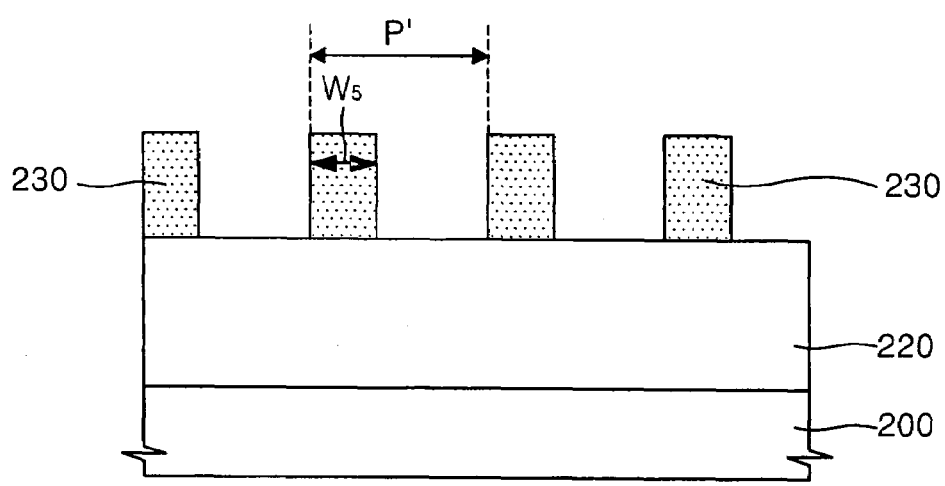
Figure 10A:
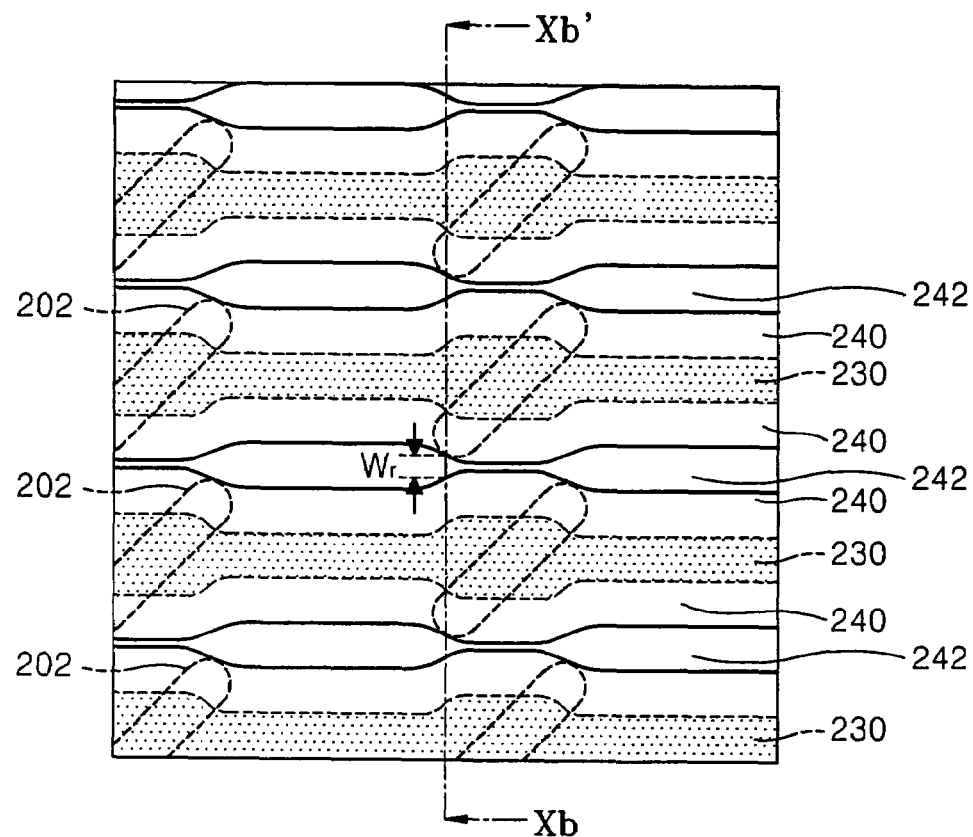
Figure 10B:
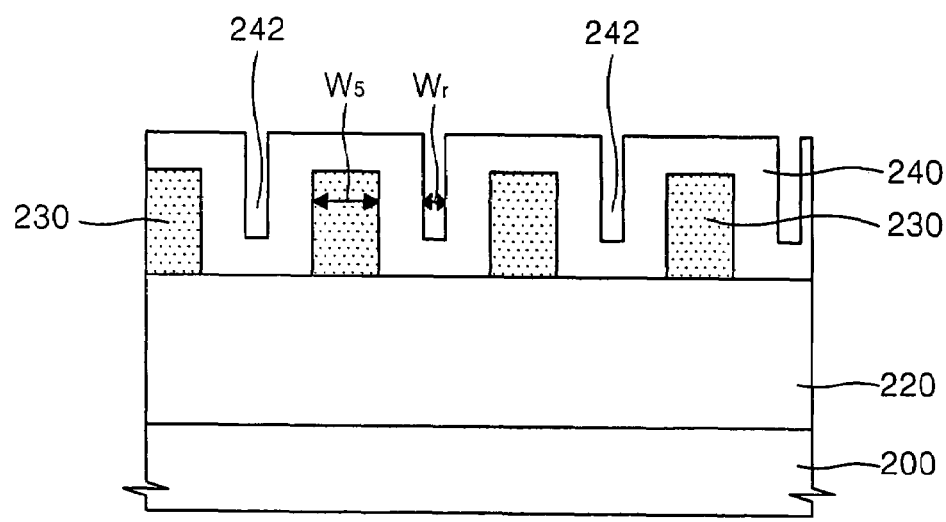
Figure 13A:
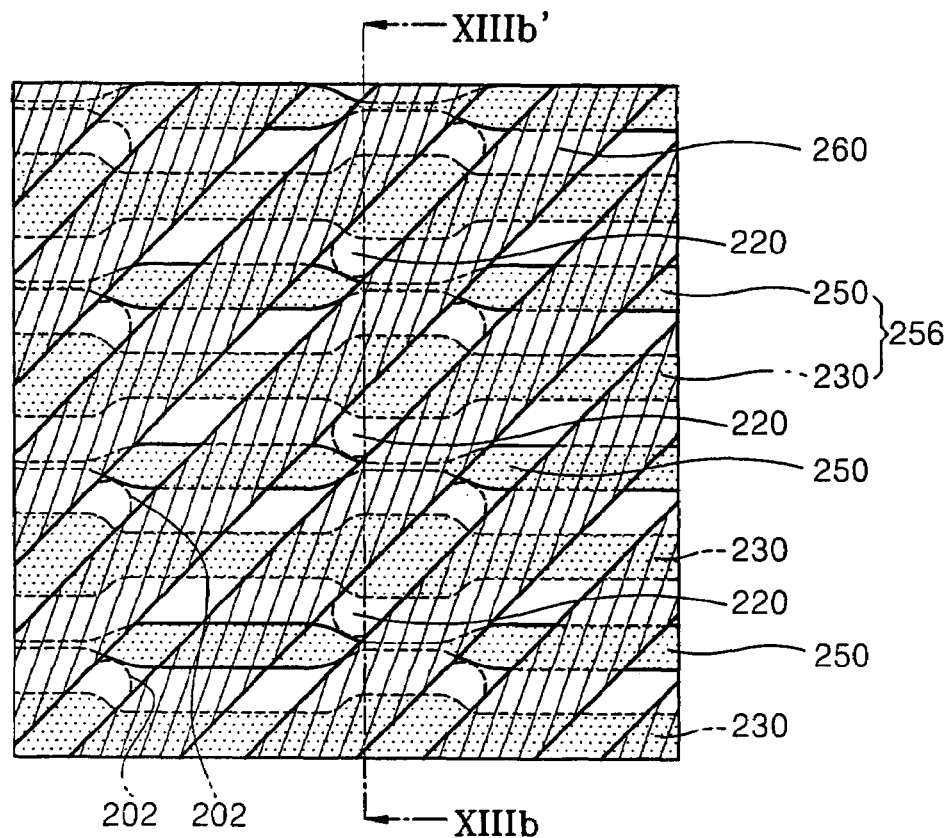
Figure 13B:
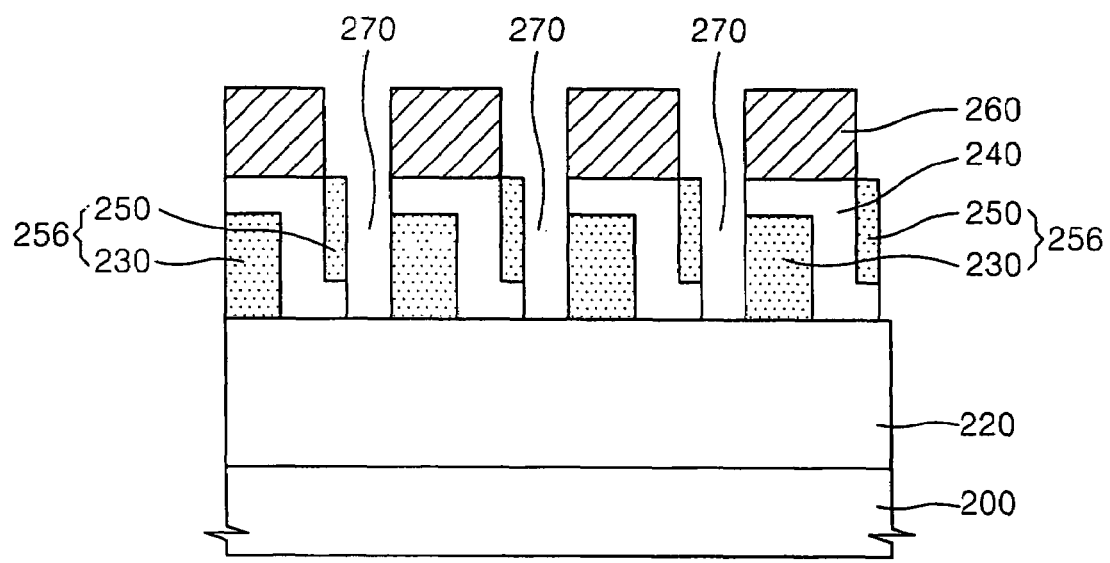
Figure 14A:
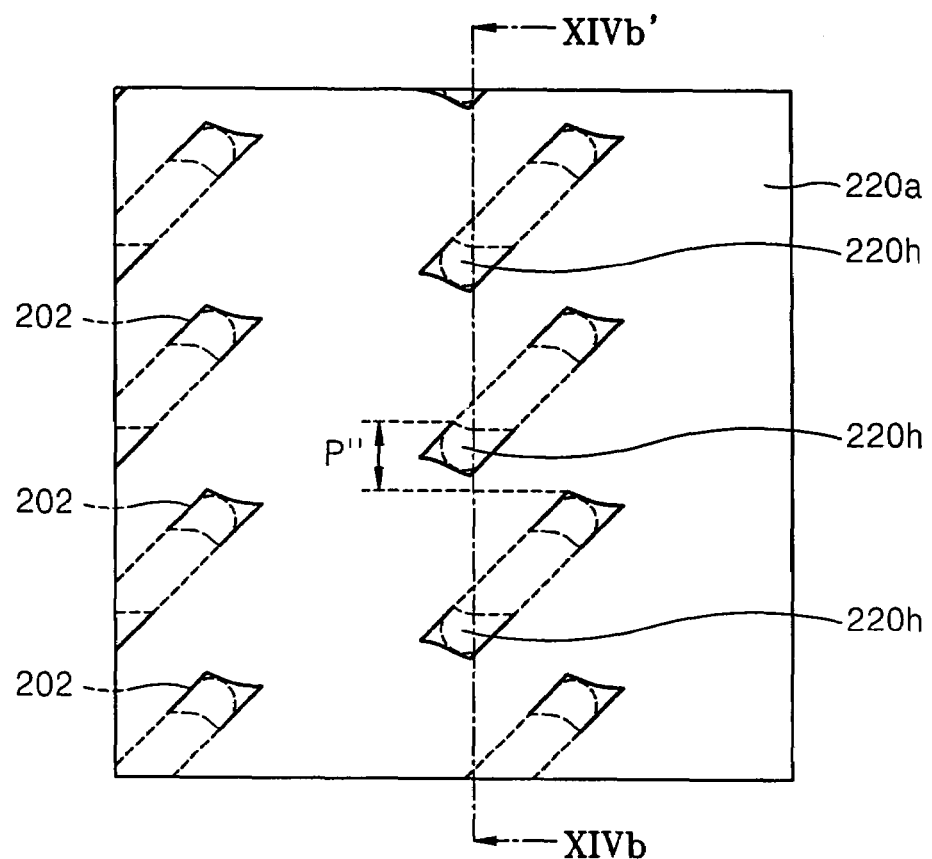
Figure 14B:
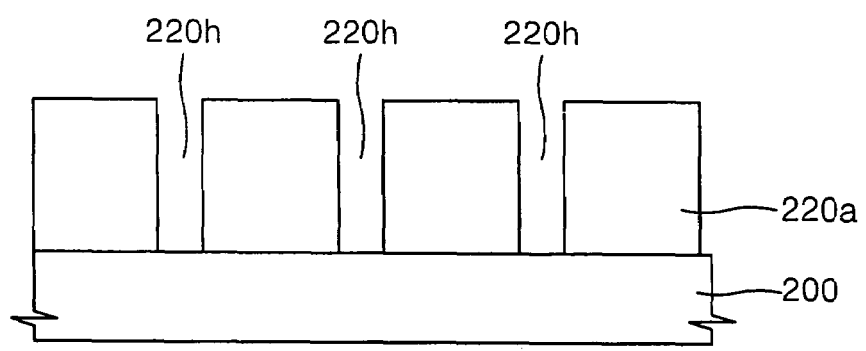

FIGS. 9A, 10A, through FIG. 14A are plan views illustrating a method of forming fine patterns to embodiments of the present invention. FIGS. 9B, 10B, through FIG. 14B are related sectional views of FIGS. 9A, 1A, through 14A. The geometry and location of an exemplary active region 202 is incorporated in the description that follows to facilitate a better understanding of the embodiments illustrated in FIGS. 9A, 10A through FIG. 14A.

FIG. 9B is a sectional view taken along line IXb-IXb' of FIG. 9A. Referring to FIG. 9A and FIG. 9B, a material layer 220 is formed on a semiconductor substrate 200 in similar manner to that of material layer 120 of FIGS. 1A and 1B. A plurality of first hard mask patterns 230 are formed on material layer 220 in similar manner to that of first hard mask patterns 130 of FIGS. 1A and 1B.

In embodiments illustrated in FIGS. 9A through FIG. 14B, first hard mask patterns 230 are formed in a parallel arrangement in a first direction. As illustrated in FIGS. 9A and 9B, a line pattern may be formed for first hard mask patterns 230 with a first pitch P'. As also illustrated in FIG. 9A, respective first hard mask patterns 230 may be formed with a first variable (non-uniform) width W5 in the first direction. For example, first hard mask patterns 230 include first width portions having a first width Ws1. First width portions of first hard mask pattern 230 are formed in correlation with an active region 202. Each first hard mask pattern 230 also includes second width portions having a second width Ws2 less than the first width Ws1. Second width portions of the first hard mask patterns connect adjacent first width portions, and generally reside outside the boundaries of active regions 202. With this type of arrangement, the sidewalls of the first hard mask patterns 230 may be formed with a curved shape, for example, an S type (or serpentine type) shape.

FIG. 10B is a sectional view taken along line Xb-Xb' of FIG. 10A. Referring to FIG. 10A and FIG. 10B, a buffer layer 240 is formed with a uniform thickness on first hard mask patterns 230 and portions of material layer 220 exposed through first hard mask patterns 230 in similar manner to that of buffer layer 140 of FIGS. 2A and 2B. Referring to FIGS. 9A through FIG. 14B, since buffer layer 240 is formed on the sidewalls of first hard mask patterns 230—which has a variable width, upper surface recesses 242 having a second variable width Wr are formed. The second variable width will vary with the thickness of buffer layer 240 and in relation to the varying separation distances between adjacent first hard mask patterns 230. In some cases, the second variable width Wr associated with upper surface recess 242 may actually reach zero. Hence, some upper surface recesses 242 may not be formed in relation to some adjacent first hard mask patterns 230.

Figure 11A:
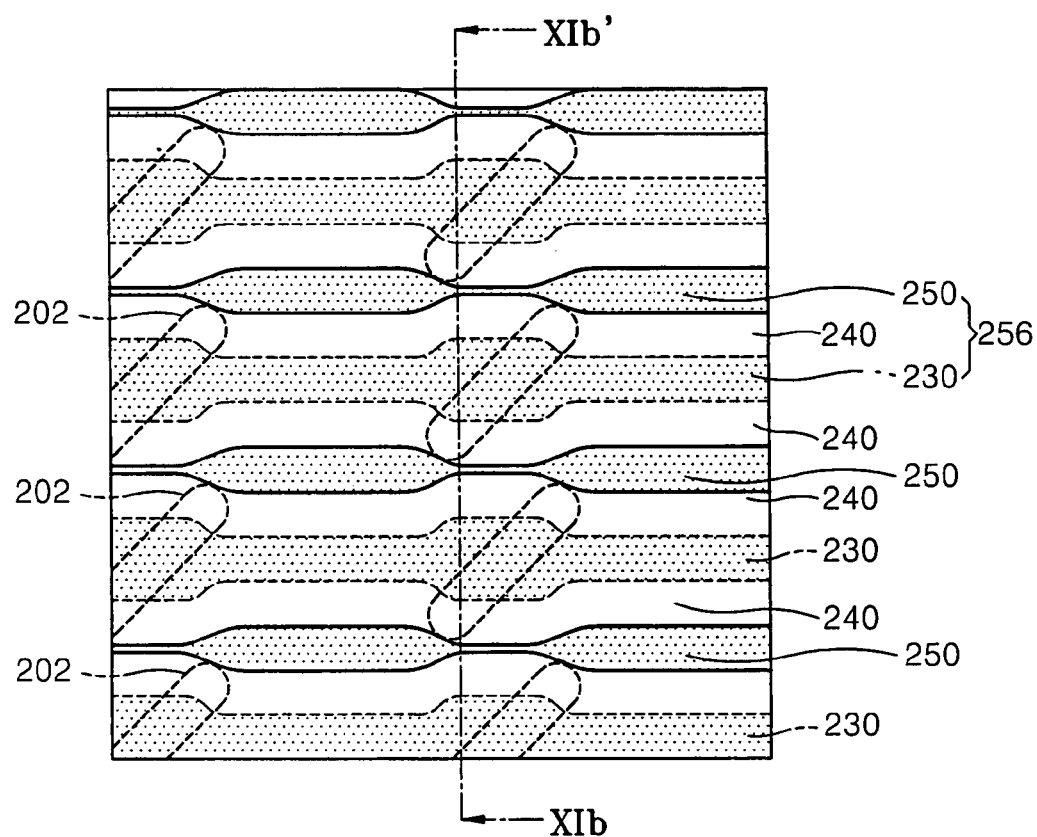
Figure 11B:
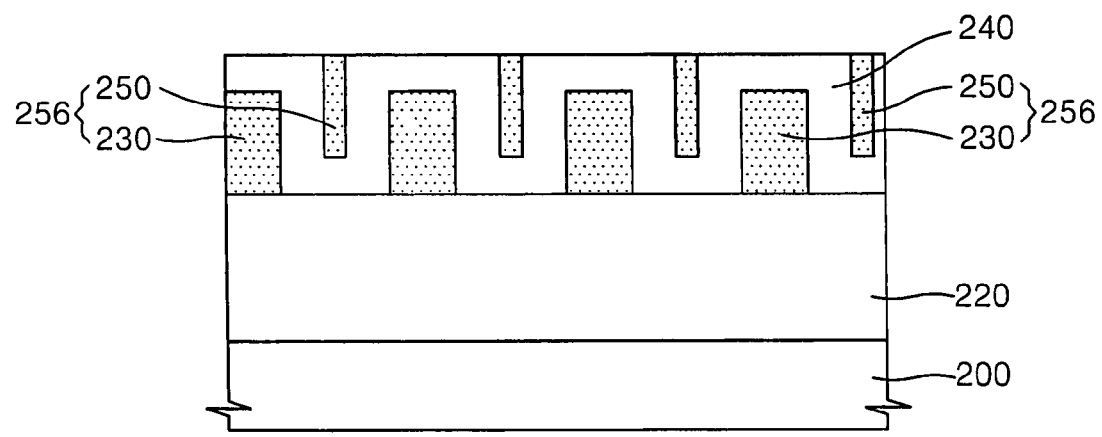

FIG. 11B is a sectional view taken along line XIb-XIb' of FIG. 11A. Referring to FIG. 11A and FIG. 11B a hard mask layer is formed on the resultant structure shown in FIG. 10B including buffer layer 240 in a manner similar to that of second hard mask patterns 150a of FIGS. 3A, 3B, 4A and 4B. Again, a conventional CMP process may be used to polish the hard mask layer until an upper surface portion is removed to expose the upper surface of buffer layer 240. In this manner, interleaving second hard mask patterns 250 are formed by the portions of the hard mask layer in-filling upper surface recesses 242. As before, first hard mask patterns 230 and second hard mask patterns 250 form a composite hard mask pattern 256 that is subsequently used as an etch mask for etching material layer 220.

Figure 12A:
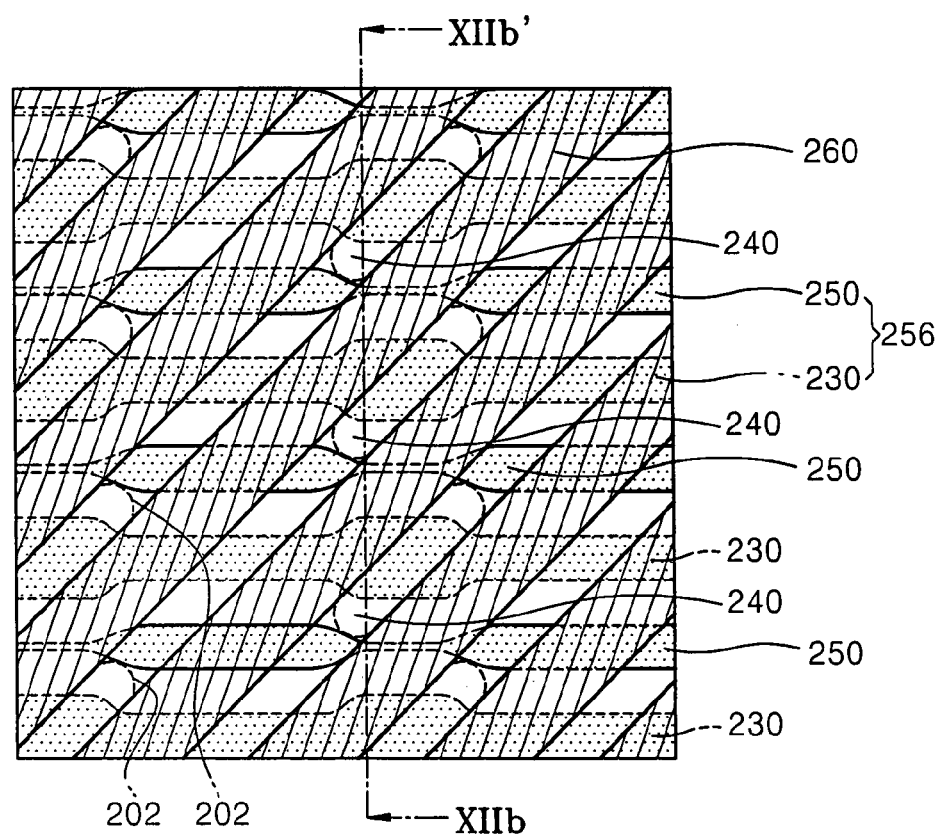
Figure 12B:
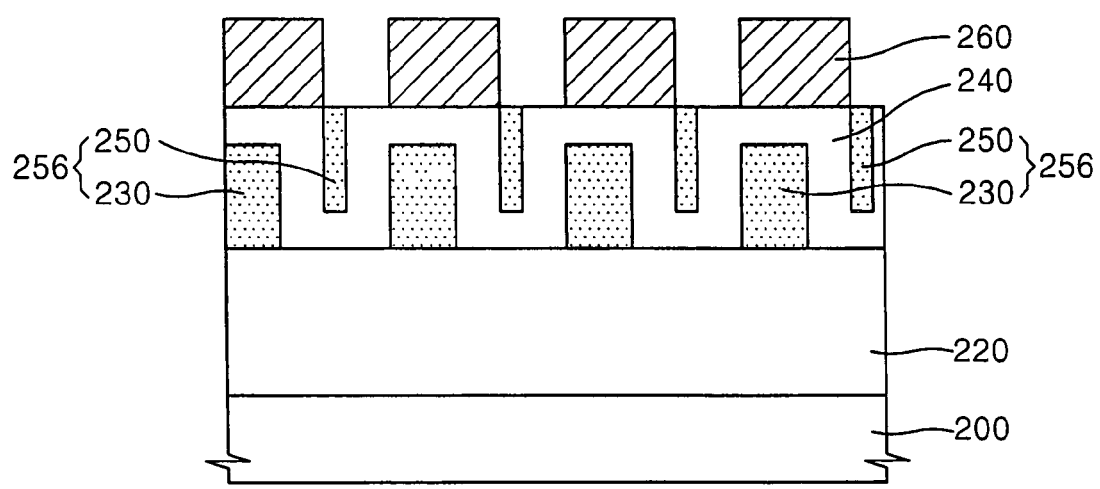

FIG. 12B is a sectional view taken along line XIIb-XIIb' of FIG. 12A. Referring to FIG. 12A and FIG. 12B, upper mask patterns 260 are formed on the resultant structure shown in FIG. 11B including composite mask pattern 256 in a manner similar to that of composite mask patterns 156 of FIGS. 5A and 5B. FIG. 12A shows upper mask patterns 260 having a line pattern shape, but the invention is not limited thereto. Upper mask patterns 260 may be formed in various other shapes depending on the desired cross-sectional geometry of the contact holes formed through material layer 220.

Predetermined portions of the upper surface of buffer layer 240 and the second hard mask patterns 250 are exposed by mask patterns 260. The exposed portions of the upper surface of buffer layer 240 correspond to regions where contact holes 220h (FIGS. 14A and 14B) are to be formed through insulating layer 220 during a subsequent etching process.

FIG. 13B is a sectional view taken along line XIIIb-XIIIb' of FIG. 13A. Referring to FIG. 13A and FIG. 13B, portions of buffer layer 240 exposed by mask patterns 260 and composite hard mask 256 are anisotropically etched in a manner similar to that described in relation to FIGS. 6A and 6B to form hard mask holes 270 exposing sidewalls of first hard mask patterns 230 and second hard mask patterns 250. Selected portions of the upper surface of material layer 220 are exposed through hard mask holes 270.

FIG. 14B is a sectional view taken along line XIVb-XIVb' of FIG. 14A. Referring to FIG. 14A and FIG. 14B, portions of the material layer 220 exposed through hard mask holes 270 are anisotropically etched using upper mask patterns 260, first hard mask patterns 230, and second hard mask patterns 250 as an etch mask in a manner similar to that described above in relation to FIGS. 7A and 7B in order to form patterned material layer 220a including contact holes 220h. At this point in the fabrication process, upper mask patterns 260, residual portions of buffer layer 240, first hard mask patterns 230, and second hard mask patterns 250 remaining on patterned material layer patterns 220a may be removed.

If the first pitch P' of first hard mask patterns 230 is a minimum pitch allowable within a limit of resolution for a conventional photolithography process, contact holes 220h may be formed in patterned material layer 220a with a final pitch P''' that is much smaller than the first pitch P'. Thus, contact hole 220h widths and separation distances between adjacent contact holes 220h may be realized with a much finer pitch than that realizable through the use of conventional photolithography processes. Furthermore, the disclosed double patterning process makes use of self-aligned second hard mask patterns 250 and first hard mask patterns 230 to form composite hard mask patterns 256. Since contact holes 220h may be formed using a dry-etching process in conjunction with composite hard mask patterns 256 and upper mask patterns 260, it is relatively easy to align contact holes 220h into desired positions while also providing adequate etch margins. Contact holes 220h may be readily formed in a variety of cross-sectional geometries, including one or more curved surfaces. This may be accomplished by defining geometries and relative layout arrangements for first hard mask patterns 230, second hard mask patterns 250, and upper mask patterns 260.

In a method of forming fine patterns, such as those used in the fabrication of semiconductor devices, according to embodiments of the present invention, contact patterns may be formed with very fine pitches and excellent critical dimension (CD) uniformity by employing the double patterning process that effectively overcomes the resolution limits of conventional photolithography processes. This is particularly true in the formation of the hard masks defining the geometry of a set of contact holes having a very fine pitch. That is, the location of the contact holes may be determined by the layout positioning of first hard mask patterns formed using a conventional photolithography process, and the self-aligned, relative layout positioning of second (sacrificial) hard mask patterns and upper mask patterns. Therefore, the process of accurately defining the cross-sectional geometry of the contact holes is relatively straight-forward and well controlled. In this manner, sufficient etch margin may be ensured between adjacent contact holes.

In the foregoing description, the use of terms such as first, second, etc., vertical and horizontal, upper and lower, etc., is entirely relative. No particular ordering or orientation is mandated. Such terms merely distinguish related components in the foregoing embodiments.

While the invention has been particularly shown and described with reference to exemplary embodiments thereof, it will be understood by one of ordinary skill in the art that various changes in form and details may be made therein without departing from the scope of the present invention as defined by the following claims.

What is claimed is:

1. A method of forming a plurality of contact holes in a material layer formed on a substrate, the method comprising:
    forming a parallel plurality of first hard mask patterns separated by a first pitch in a first direction on the material layer;
    after forming the parallel plurality of first hard mask patterns, forming a self-aligned parallel plurality of second hard mask patterns interleaved with the first hard mask patterns and separated from the first hard mask patterns by a buffer layer to form composite mask patterns comprising the first hard mask patterns and the second hard mask patterns;
    after forming the parallel plurality of second hard mask patterns, forming a plurality of upper mask patterns in a second direction intersecting the first direction to mask selected portions of the buffer layer in conjunction with the composite mask patterns;
    etching non-selected portions of the buffer layer using the composite hard mask patterns and the upper mask patterns as an etch mask to form a plurality of hard mask holes exposing selected portions of the material layer between one of the first hard mask patterns and one of the second hard mask patterns, wherein all of the second hard mask patterns remain between adjacent ones of the first hard mask patterns after etching of the non-selected portions of the buffer layer; and
    etching the selected portions of the material layer to form the plurality of contact holes.

2. The method of claim 1, wherein each of the first hard mask patterns and the second hard mask patterns are formed as parallel line patterns.

3. The method of claim 2, wherein at least one of the first hard mask patterns and the second hard mask patterns is formed with a uniform width.

4. The method of claim 2, wherein at least one of the first hard mask patterns and the second hard mask patterns is formed with a variable width.

5. The method of claim 4, wherein at least one of the first hard mask patterns and the second hard mask patterns has a curved sidewall.

6. The method of claim 1, wherein the first hard mask patterns and the second hard mask patterns are respectively composed of materials having different etch characteristics relative to the buffer layer.

7. The method of claim 6, wherein each of the first hard mask patterns and the second hard mask patterns is formed from at least one material selected from a group of materials consisting of an oxide, a nitride, an oxynitride, a polysilicon, and metal.

8. The method of claim 6, wherein the buffer layer is formed from a material different from that used to form the first hard mask patterns and the second hard mask patterns, wherein the buffer layer is formed from at least one material selected from a group of materials consisting of an oxide, a nitride, an oxynitride, a polysilicon, and a metal.

9. The method of claim 1, wherein the first hard mask patterns and the second hard mask patterns are formed from a nitride or a polysilicon and the buffer layer is formed from an oxide.

10. The method of claim 1, wherein the first hard mask patterns and the second hard mask patterns are formed from an oxide or a polysilicon and the buffer layer is formed from a nitride or an oxynitride.

11. The method of claim 1, wherein forming the self-aligned parallel plurality of second hard mask patterns further comprises:
    forming a buffer layer of uniform thickness on the first hard mask patterns, the buffer layer defining upper surface recesses;
    forming a hard mask layer on the buffer layer in-filling the upper surface recesses; and
    removing an upper portion of the hard mask layer until an upper surface of the buffer layer is exposed in order to form the second hard mask patterns.

12. The method of claim 11, wherein a chemical mechanical polishing (CMP) process is used to remove the upper portion of the hard mask layer.

13. The method of claim 1, wherein the upper mask patterns are formed from a photoresist material.

14. The method of claim 1, wherein the upper mask patterns are formed from a stacked combination of a spin on carbon (SOC) film, an anti-reflective coating (ARC) film, and a photoresist layer.

15. The method of claim 14, wherein the ARC film comprises silicon, an organic material, or a mixture thereof.

16. The method of claim 1, wherein the material layer is an insulating layer.

17. The method of claim 1, wherein the substrate is a semiconductor substrate comprising a plurality of island-shaped active regions and at least one of the plurality of contact holes is formed in relation to one of the plurality of active regions.

18. The method of claim 17, wherein at least one contact hole forms a buried contact (BC) electrically connecting a storage node of a capacitor to the one active region, or a direct contact (DC) electrically connecting a bit line to the one active region.

19. The method of claim 17, wherein each one of the first hard mask patterns comprises a plurality of first width portions formed in respective association with one of the plurality of active regions and a plurality of second width portions connecting adjacent first width portions.

20. The method of claim 19, wherein first width portions are wider than the second width portions.

* * * * *